United States Patent [19]
Barden et al.

[11] Patent Number: 5,134,089
[45] Date of Patent: Jul. 28, 1992

[54] MOS TRANSISTOR ISOLATION METHOD

[75] Inventors: John M. Barden, Tempe; Ping Wang, Chandler, both of Ariz.

[73] Assignee: Motorola, Inc., Schaumburg, Ill.

[21] Appl. No.: 767,586

[22] Filed: Sep. 30, 1991

[51] Int. Cl.$^5$ .................. H01L 21/76; H01L 21/302
[52] U.S. Cl. .................................. 437/70; 437/61; 437/69
[58] Field of Search .................. 437/69, 70, 61, 974

[56] References Cited
U.S. PATENT DOCUMENTS

| | | | |
|---|---|---|---|
| 4,577,394 | 3/1986 | Peel | 437/70 |
| 4,743,566 | 5/1988 | Bastiaens et al. | 437/69 |
| 4,847,213 | 7/1989 | Pfiester | 437/70 |
| 4,942,449 | 7/1990 | Wei et al. | 437/69 |
| 5,019,526 | 5/1991 | Yamane et al. | 437/70 |
| 5,049,520 | 9/1991 | Cathey | 437/69 |

Primary Examiner—Brian E. Hearn
Assistant Examiner—Trung Dang
Attorney, Agent, or Firm—Joe E. Barbee

[57] ABSTRACT

A series of oxide growth and etch-back operations is employed to form the isolation region of an MOS device (10). The series of operations forms an oxidation susceptible layer (14) into oxidation resistant areas (21) and oxidation susceptible areas (19) thereby confining the effects of a thermal oxidation procedure to the oxidation susceptible areas (19) of the MOS device (10). The thickness of both the oxidized (19) and non-oxidized regions (21) is reduced. Another oxidation is performed and the oxidized material (19, 21) is thinned.

20 Claims, 3 Drawing Sheets

MOS TRANSISTOR ISOLATION METHOD

BACKGROUND OF THE INVENTION

The present invention relates, in general, to semiconductor devices, and more particularly, to a novel method of forming an isolation area on a semiconductor device.

The semiconductor industry previously had utilized a thick field oxide in order to provide electrical isolation between the active areas of metal oxide semiconductor (MOS) transistors that existed on a semiconductor die. The thick field oxide increased the threshold voltage of any parasitic device which existed between the MOS transistors and prevented inadvertent electrical coupling between the transistors. As advances in semiconductor processing technology reduced both the width of the active area and the spacing between active areas to sub-micron dimensions, it became difficult to provide reliable isolation between the active areas. During the field oxide growth, portions of the active area became contaminated. Often, the field oxide encroached into the active area and prevented removal of the contamination. The contamination limited the transistor's gate oxide reliability, and also limited the gate oxide breakdown to an electric field strength of less than 8 Mv/cm.

Accordingly, it is desirable to have a method of forming a field oxide that provides a thick field oxide (greater than approximately 4000 angstroms), an active area that is substantially devoid of contamination resulting from the field oxide growth, a reliable gate oxide, and a high gate oxide breakdown (greater than approximately 8 Mv/cm).

SUMMARY OF THE INVENTION

Briefly stated, the present invention includes utilizing a series of oxide growth and etch-back operations to form the isolation region of an MOS device. The series of operations forms an oxidation susceptible layer into oxidation resistant areas and oxidation susceptible areas thereby confining the effects of a thermal oxidation procedure to the oxidation susceptible areas of the MOS device. The thickness of both the oxidized and non-oxidized regions is reduced. Another oxidation is performed and the oxidized material is thinned.

DETAILED DESCRIPTION OF THE DRAWINGS

Figure 1:
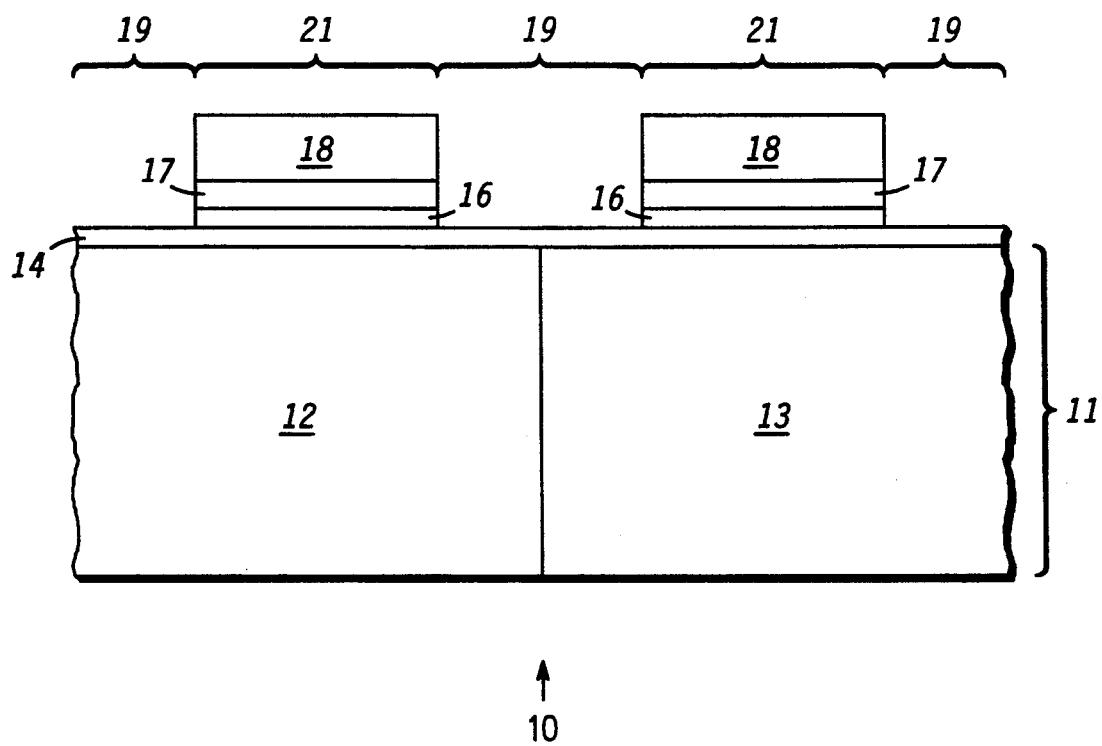
FIG. 1 illustrates an enlarged cross-section of a portion of an MOS device in a stage of manufacturing in accordance with the present invention.

FIG. 1 illustrates an enlarged cross-sectional portion of a complementary metal oxide semiconductor (CMOS) device 10 which is formed on a substrate 11. CMOS device 10 could also be a BICMOS device, a single MOS transistor, or other semiconductor device that includes an MOS transistor. Substrate 11 includes a P-type region 12 in which an N-channel transistor will be formed, and an N-type region 13 in which a P-channel transistor will be formed. In the case of a BICMOS device 10, substrate 11 may also include an epitaxial layer. As will be seen hereinafter, a series of oxide growth and etch-back operations will be utilized to form the active region of device 10.

Substrate 11 is covered by a thin layer of silicon dioxide 14 or other material which is susceptible to oxidation. Portions of silicon dioxide layer 14 will subsequently be oxidized in order to form regions of field oxide which isolate the N-channel and P-channel transistors. Overlying silicon dioxide 14 is a first thin layer of polycrystalline silicon or first polysilicon 16 which is covered by a layer of oxidation resistant material such as silicon nitride 17. First polysilicon 16 serves as a stress relief or buffer that minimizes stresses placed on substrate 11 by silicon nitride 17 during the formation of the field oxide regions. The thickness of silicon dioxide 14 is as small as possible in order to minimize the amount of field oxide that forms under the silicon nitride as will be seen hereinafter. In the preferred embodiment, silicon dioxide 14 has a thickness between approximately 100 and 1000 angstroms, polysilicon 16 is between approximately 500 and 1500 angstroms, and silicon nitride 17 has a thickness between approximately 1000 and 2000 angstroms. A second polycrystalline silicon layer or second polysilicon 18 covers silicon nitride 17.

Second polysilicon 18 is formed into a pattern wherein each portion of second polysilicon 18 identifies an active region 21. Each active region 21 is formed at the desired channel or active area location for either P-type region 12 or N-type region 13. After patterning is complete, the remaining portions of polysilicon 18 are used as a mask while removing exposed portions of silicon nitride 17 and the underlying portions of first polysilicon 16 thereby exposing portions of silicon dioxide 14. Each exposed portion of silicon dioxide 14 is in a field oxide region 19. In the preferred embodiment, the exposed portions of silicon nitride 17 are removed with standard reactive ion etch procedures that are well known to those skilled in the semiconductor art.

Figure 2:
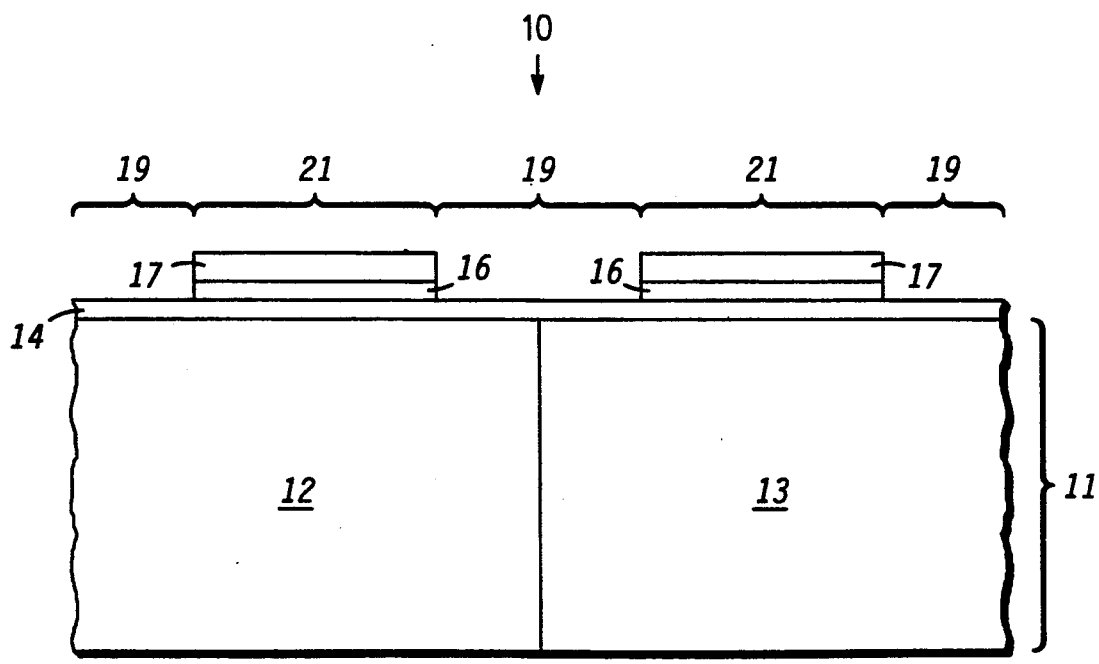
FIG. 2-FIG. 5 illustrate the MOS device of FIG. 1 in subsequent stages of manufacturing in accordance with the present invention.

Referring to FIG. 2, device 10 of FIG. 1 is illustrated in a subsequent processing stage. The elements of FIG. 2 that are the same as FIG. 1 have the same reference numerals. The remaining portions of second polysilicon 18 are then removed. In the preferred embodiment, a wet chemical etch is used to remove the exposed portions of polysilicon 18. The remaining portions of silicon nitride 17 function as a mask that now identifies each active region 21, and also forms silicon dioxide 14 into oxidation resistant regions and oxidation susceptible areas for the subsequent field oxide operation.

Figure 3:
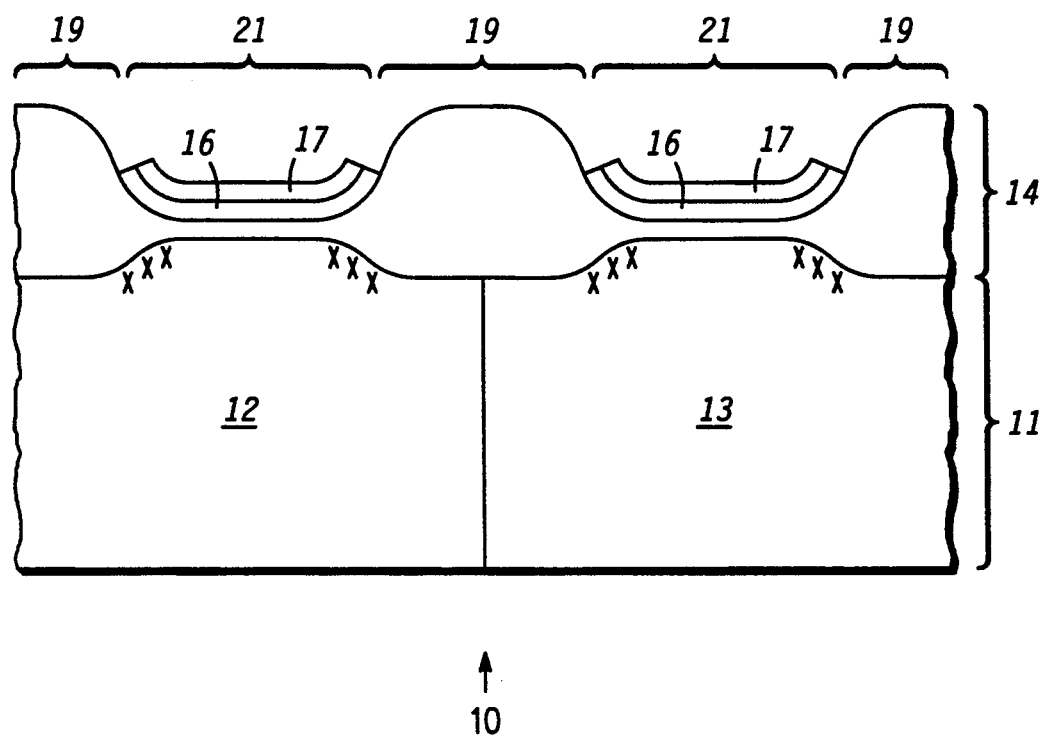

FIG. 3 illustrates device 10 of FIG. 2 after the formation of the field oxide. The elements of FIG. 3 that are the same as FIG. 2 have the same reference numerals. Between approximately 6000 and 8000 angstroms of field oxide is grown in each field oxide region 19 by thermal oxidation of the exposed portions of silicon dioxide 14. Although silicon nitride 17 functions as a mask that minimizes the growth of field oxide in active region 21, the field oxide encroaches into active region 21 by extending under the edges of silicon nitride 17 thereby lifting or bending the edges of silicon nitride 17. This encroachment reduces the width of any active area that would be formed in active region 21. Also during the thermal oxidation procedure, reactions between silicon nitride 17, silicon dioxide 14, and the thermal oxidation environment create defects in substrate 11 as illustrated by the X's shown in FIG. 3. These defects result from stress induced crystalline defects in addition to defects resulting from the Kooi effect. Both of these defect mechanisms are well known to those skilled in the semiconductor art.

Figure 4:
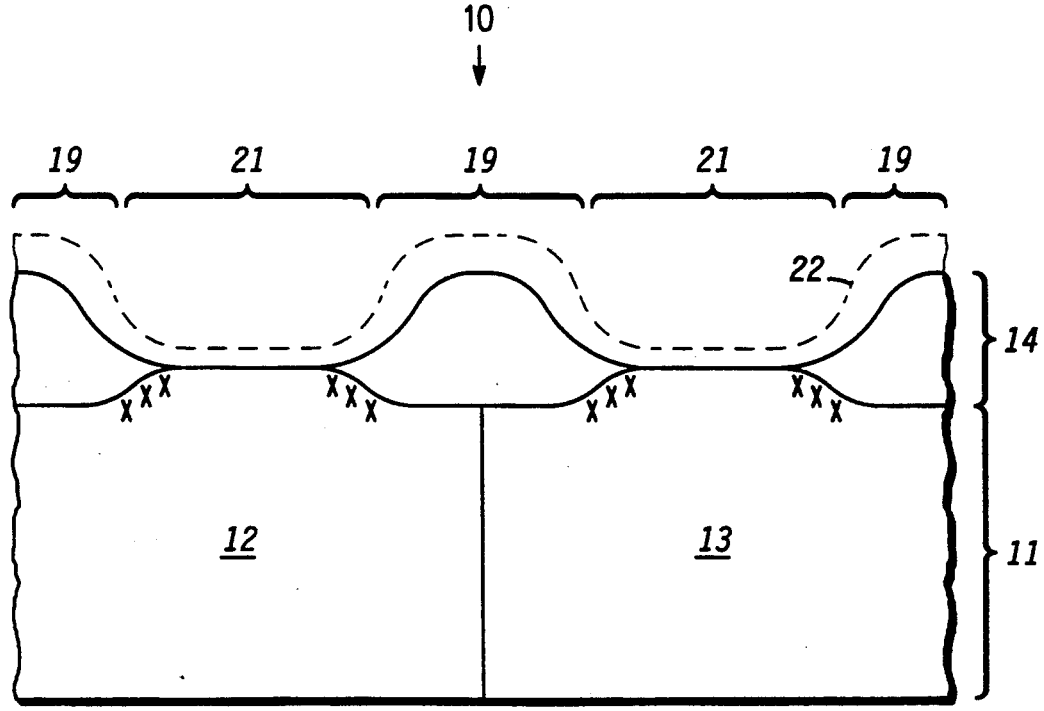

Typically, these defects are minimized by removing silicon nitride 17 and polysilicon 16, then performing an additional thermal oxidation. However, oxidation in the region near the "X"s proceeds slowly because the oxygen required for the oxidation has to penetrate through the thicker field oxide to reach silicon that can be converted to oxide. Consequently, eliminating the damaged silicon would require a long oxidation during which oxide grows faster in region 21 than in region 19. This rapid growth in active region 21 limits the maximum permissible oxidation time. Since the oxidation near the defects is slowed and the oxidation time is limited, such an oxidation would not remove all of the defects. The remaining defects would degrade the gate oxide's reliability and reduce the gate oxide breakdown below the desired 8 Mv/cm. Consequently, utilizing an oxidation to remove the defects at this stage of manufacturing would result in a low gate oxide breakdown voltage. FIG. 4 illustrates device 10 of FIG. 3 at a subsequent processing stage. The elements of FIG. 4 that are the same as FIG. 3 have the same reference numerals. In order to minimize the field oxide's effect on the defects, a series of oxidation and etch-back operations are utilized to reduce the thickness of the field oxide, then remove the defects, then grow fresh oxide. This growth of fresh oxide is often referred to as sacrificial oxidation since a portion of the silicon is sacrificed by forming oxide in order to remove the defects.

Silicon nitride 17 and polysilicon 16 are removed thereby exposing the portion of silicon dioxide 14 that is in active region 21. The field oxide thickness near the contamination is reduced by isotropically etching silicon dioxide 14 in both field oxide region 19 an active region 21 thereby uniformly reducing the thickness of silicon dioxide layer 14. In the preferred embodiment, the isotropic etch is performed by exposing device 10 to a buffered hydrofluoric acid (HF) solution for approximately forty-five seconds. The solution comprises, by weight, approximately thirty percent ammonium fluoride ($NH_4F$), six percent HF, and sixty-four percent water. In this preferred embodiment, the etching reduces the thickness of silicon dioxide 14 in active region 21 to approximately zero which typically reduces the thickness in field oxide region 19 between approximately 600 and 950 angstroms. The original position of silicon dioxide 14 is shown by a dashed line 22. Comparison of dashed line 22 to the position after the etch illustrates the reduction.

Figure 5:
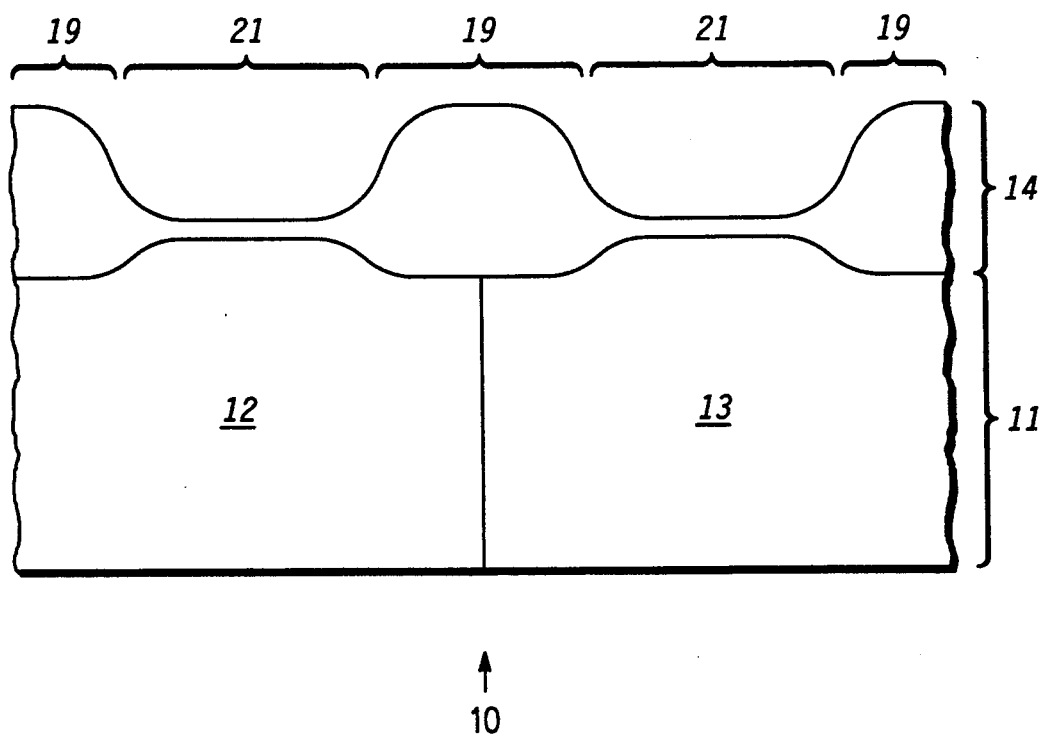

Referring to FIG. 5, after the isotropic etching is complete, a second thermal oxidation procedure is performed on device 10 of FIG. 4 in order to remove the defects in substrate 11. In the preferred embodiment, this second oxidation increases the thickness of silicon dioxide layer 14 in active region 21 by an amount between approximately 800 and 1200 angstroms while the thickness in field oxide region 19 is increased between approximately 300 to 600 angstroms. The different growth rates is a result of the thickness of the field oxide as previously discussed in FIG. 3.

Figure 6:
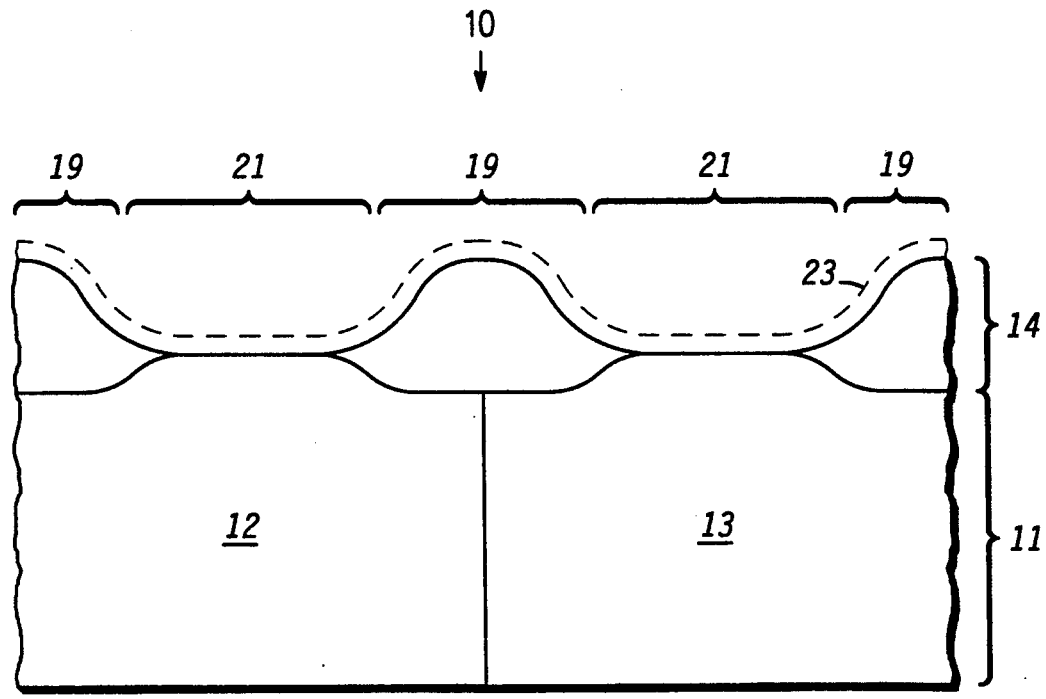
FIG. 6 illustrates the MOS device of FIG. 5 after forming a field oxide in accordance with the present invention.

Referring to FIG. 6, device 10 of FIG. 5 is exposed to a second isotropic etch procedure to again reduce the thickness of silicon dioxide 14 in active region 21. The second isotropic etch also reduces the thickness of silicon dioxide 14 in field oxide area 19. In the preferred embodiment, the isotropic etch is performed by exposing device 10 to the buffered hydrofluoric acid solution, previously described relating to FIG. 4, for approximately one minute and forty-five seconds. In this preferred embodiment, the etching reduces the thickness of silicon dioxide 14 in active region 21 to approximately zero, while the thickness in field oxide region 19 is reduced to approximately 4700 angstroms. After the etching is complete the remaining portions of device 10 can be formed.

The field oxide thickness that results from using this series of oxide growth and etch-back operations has been demonstrated to increase the gate oxide reliability and to provide effective gate oxide breakdown voltages. By way of example, the procedure was utilized to form MOS devices having both active region widths and field oxide region widths of approximately 0.8 microns. The gate oxide's reliability was determined as a percent of the total devices tested that withstood a gate oxide electric field in excess of between 8 and 19 Mv/cm. Generally, it is desirable to have in excess of 90 percent of all devices withstand such an electric field. For the devices tested, approximately 91 percent withstood the electric field. In addition, the completed devices exhibited field oxide breakdown voltages in excess of 13.5 volts, well in excess of the required 10.0 volts. Devices of similar dimensions produced without the series of oxide growth and etch-back operations resulted in gate oxide reliability of approximately 83 percent and maximum field oxide breakdowns of approximately 10.0 volts, while most of the devices had field oxide breakdowns below 10.0 volts.

While the invention is described with specific preferred embodiments, it is evident that many alternatives and variations will be apparent to those skilled in the semiconductor arts. More specifically the invention has been described for a particular CMOS transistor structure, although the method is directly applicable to other MOS transistors including BICMOS, PMOS, and NMOS, as well as to other material thicknesses and spacings.

By now it should be appreciated that there has been provided a novel way to fabricate isolation regions for MOS devices. Forming the device's field oxide through a series of oxide growth and etch-back operations minimizes the defects near the field oxide which improves the gate oxide reliability and the gate oxide breakdown voltage. The series of operations also minimizes the amount of oxide in the active region while maximizing the amount of oxide in the field oxide region. This procedure facilitates providing closely spaced very small geometry MOS devices with high gate oxide reliability and a high field oxide breakdown voltage. The resulting MOS devices are suitable for a variety of analog and digital applications including, but not limited to, static and dynamic memories, analog to digital converters, gate arrays, and various other semiconductor devices.

We claim:
1. An MOS transistor isolation method comprising:
   providing a semiconductor substrate having a P-type region and an N-type region;
   covering the substrate with a thin layer of silicon dioxide;
   covering the silicon dioxide with a first polysilicon layer;
   covering the first polysilicon layer with a layer of silicon nitride;

covering the silicon nitride layer with a second polysilicon layer;

patterning the second polysilicon layer to form a mask wherein a first portion of the mask covers a portion of the N-type region and a second portion of the mask covers a portion of the P-type region thereby exposing portions of the silicon nitride layer;

removing the exposed portions of the silicon nitride thereby exposing portions of the first polysilicon layer;

removing the exposed portions of the first polysilicon layer thereby exposing a first portion of the silicon dioxide layer;

removing the mask thereby leaving a second portion of the first polysilicon layer covered by the silicon nitride;

thermally oxidizing the first portion of the silicon dioxide layer thereby forming a field oxide having a first thickness;

removing the silicon nitride thereby exposing the second portion of the first polysilicon layer;

removing the second portion of the first polysilicon layer thereby exposing a second portion of the silicon dioxide layer having a second thickness;

reducing the first thickness to a third thickness and the second thickness to a fourth thickness by isotropically etching the field oxide and the second portion of the silicon dioxide layer;

thermally oxidizing the field oxide and the second portion of the silicon dioxide layer thereby increasing the third thickness of the field oxide to a fifth thickness and the fourth thickness of the second portion of the silicon dioxide layer to a sixth thickness;

reducing the fifth thickness and the sixth thickness by etching the field oxide and the second portion of the silicon dioxide layer with an isotropic etch.

2. The method of claim 1 wherein covering the substrate with the thin layer of silicon dioxide includes covering the substrate with the thin layer of silicon dioxide having a thickness between 100 and 1000 angstroms.

3. The method of claim 1 wherein covering the silicon dioxide with the first polysilicon layer includes covering the silicon dioxide with the first polysilicon layer having a thickness between approximately 500 and 1500 angstroms.

4. The method of claim 1 wherein removing the exposed portions of the silicon nitride includes etching the exposed silicon nitride with a reactive ion etch procedure.

5. The method of claim 1 wherein the removing the mask step includes etching with a wet chemical etch.

6. The method of claim 1 wherein the reducing the first thickness step includes etching with a buffered hydrofluoric acid solution.

7. The method of claim 1 wherein the reducing the first thickness step includes reducing the first thickness and the second thickness by an amount between approximately 600 and 950 angstroms.

8. A method of isolating MOS devices comprising:
providing a semiconductor substrate;
covering the substrate with a thin silicon dioxide layer;
forming the thin silicon dioxide layer into an oxidation resistant area and a first oxidation susceptible area by covering the oxidation resistant area with an oxidation resistant material;

forming a field oxide having a first thickness by thermally oxidizing the first oxidation susceptible area;

removing the oxidation resistant material for the purpose of converting the oxidation resistant area into a second oxidation susceptible area having a second thickness;

reducing the second thickness of the second oxidation susceptible area to a third thickness while reducing the first thickness of the field oxide to a fourth thickness;

thermally oxidizing the field oxide and the second oxidation susceptible area thereby increasing the third thickness of the second oxidation susceptible area to a fifth thickness and increasing the fourth thickness of the field oxide to a sixth thickness; and reducing the fifth thickness and the sixth thickness substantially simultaneously.

9. The method of claim 8 further including forming a thin polysilicon layer on the thin silicon dioxide layer prior to the step of forming the thin silicon dioxide layer into a plurality of oxidation resistant areas.

10. The method of claim 8 wherein the forming the thin silicon dioxide layer into the oxidation resistant area step includes covering the oxidation resistant area with silicon nitride.

11. The method of claim 8 wherein reducing the second thickness of the active region to a third thickness includes etching the active region and the field oxide with a buffered hydrofluoric acid solution.

12. The method of claim 8 wherein the reducing the second thickness of the second oxidation susceptible area step includes reducing the first thickness between approximately 600 and 950 angstroms.

13. The method of claim 8 wherein reducing the fifth thickness and the sixth thickness substantially simultaneously includes etching the field oxide and the active region with a buffered hydrofluoric acid solution.

14. The method of claim 8 wherein reducing the fifth thickness and the sixth thickness substantially simultaneously includes reducing the fifth thickness and the sixth thickness substantially simultaneously until the fifth thickness is approximately zero.

15. A method of isolating MOS devices comprising:
providing a semiconductor substrate having a thin layer of an oxidation susceptible material;
thermally oxidizing a first portion of the oxidation susceptible layer and not oxidizing a second portion of the oxidation susceptible layer thereby forming a first thickness of the first portion and a second thickness of the second portion;
reducing the first thickness while also reducing the second thickness;
thermally oxidizing the first portion and the second portion; and
thinning the first portion and the second portion.

16. The method of claim 15 wherein providing the substrate having the thin layer of the oxidation susceptible material includes providing the substrate having a thin layer of silicon dioxide.

17. The method of claim 15 wherein thinning the first portion and the second portion includes thinning the second portion until the second portion has a thickness of approximately zero.

18. The method of claim 15 wherein the step of thermally oxidizing the first portion of the oxidation susceptible layer and not oxidizing the second portion includes covering the second portion of the oxidation susceptible layer with silicon nitride prior to the thermal oxidation procedure, and removing the silicon nitride subsequent to the thermal oxidation procedure.

19. The method of claim 15 wherein the reducing the first thickness step includes etching both the first portion and the second portion.

20. The method of claim 15 further including forming a thin polysilicon layer covering the second portion of the oxidation susceptible material prior to the step of thermally oxidizing the first portion of the oxidation susceptible layer, and removing the thin polysilicon layer prior to the step of reducing the first thickness.

* * * * *